(12) United States Patent
Wang et al.

(10) Patent No.: US 10,475,513 B2
(45) Date of Patent: Nov. 12, 2019

(54) RESISTIVE MEMORY AND RESISTANCE WINDOW RECOVERY METHOD OF RESISTIVE MEMORY CELL THEREOF

(71) Applicant: Winbond Electronics Corp., Taichung (TW)

(72) Inventors: Ping-Kun Wang, Taichung (TW); Shao-Ching Liao, Taichung (TW); Ming-Che Lin, Taichung (TW); Min-Chih Wei, Taichung (TW); Chuan-Sheng Chou, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/997,717

(22) Filed: Jun. 5, 2018

(65) Prior Publication Data

US 2018/0366197 A1   Dec. 20, 2018

(30) Foreign Application Priority Data

Jun. 19, 2017  (CN) .......................... 2017 1 0463294

(51) Int. Cl.
*G11C 13/00* (2006.01)
*H01L 45/00* (2006.01)

(52) U.S. Cl.
CPC ........ *G11C 13/0097* (2013.01); *G11C 13/004* (2013.01); *G11C 13/0007* (2013.01); *G11C 13/0069* (2013.01); *G11C 13/0026* (2013.01); *G11C 13/0028* (2013.01); *G11C 2013/009* (2013.01); *G11C 2013/0045* (2013.01);

(Continued)

(58) Field of Classification Search
CPC ............ G11C 13/0002; G11C 13/0033; G11C 13/0035; G11C 13/0097; G11C 2213/79; G11C 2213/82

See application file for complete search history.

(56) References Cited

U.S. PATENT DOCUMENTS 6,930,909 B2 * 8/2005 Moore ............... G11C 13/0004
365/148
8,000,127 B2   8/2011 Hamilton et al.
(Continued)

FOREIGN PATENT DOCUMENTS

CN     101783183     7/2010
TW     201616501    5/2016

OTHER PUBLICATIONS

Simone Balatti et al., "Voltage-Controlled Cycling Endurance of HfOx-Based Resistive-Switching Memory", IEEE Transactions on Electron Devices, Jul. 2015, pp. 1-8.

*Primary Examiner* — Vanthu T Nguyen
(74) *Attorney, Agent, or Firm* — JCIPRNET

(57) ABSTRACT

A resistive memory and a resistance window recovery method for a resistive memory cell thereof are provided. During a first period, an over reset voltage difference is applied between a top electrode and a bottom electrode of the resistive memory cell, wherein the over reset voltage difference falls in a reset complementary switching (reset-CS) voltage range of the resistive memory cell. During a second period, a set voltage difference is applied between the top electrode and the bottom electrode of the resistive memory cell to increase a compliance current of the resistive memory cell. During a third period, a reset operation is performed on the resistive memory cell.

16 Claims, 3 Drawing Sheets

(52) U.S. Cl.
CPC ...... *G11C 2213/15* (2013.01); *G11C 2213/31* (2013.01); *G11C 2213/52* (2013.01); *H01L 45/1233* (2013.01); *H01L 45/1253* (2013.01); *H01L 45/143* (2013.01); *H01L 45/146* (2013.01); *H01L 45/147* (2013.01)

(56) References Cited

U.S. PATENT DOCUMENTS

| | | | |
|---|---|---|---|
| 8,488,366 B2 * | 7/2013 | Kurosawa | G11C 13/0004 365/148 |
| 9,064,573 B2 * | 6/2015 | Kawai | G11C 13/0069 |
| 9,286,976 B2 | 3/2016 | Lin et al. | |
| 9,378,817 B2 * | 6/2016 | Kawai | G11C 13/0069 |
| 2013/0058153 A1 * | 3/2013 | Chang | G11C 13/0007 365/148 |

\* cited by examiner

RESISTIVE MEMORY AND RESISTANCE WINDOW RECOVERY METHOD OF RESISTIVE MEMORY CELL THEREOF

CROSS-REFERENCE TO RELATED APPLICATION

This application claims the priority benefit of China application serial no. 201710463294.5, filed on Jun. 19, 2017. The entirety of the above-mentioned patent application is hereby incorporated by reference herein and made a part of this specification.

BACKGROUND OF THE INVENTION

Field of the Invention

The invention relates to a memory and particularly relates to a resistive memory and a resistance window recovery method for a resistive memory cell thereof.

Description of Related Art

Resistive random access memory (RRAM) is a type of non-volatile memory. RRAM can retain or store values by changing the resistance state. A resistive memory has excellent compatibility with the integrated circuit manufacturing process. The resistive memory has a high write speed and the write voltage is lower, which meets the low power consumption requirement of portable electronic products.

In the resistive memory, the three operations, i.e., forming, set, and reset, are three important steps for ensuring the electrical characteristics and data retention of the resistive memory cell. During the set/reset operation, the input voltage may need to be raised gradually and repeatedly, which is the so-called ramping operation. For some problematic memory cells, if an overly high voltage is used to perform the reset operation (or set operation) of the resistive memory cell, it may increase the current of the resistive memory cell that should be in a low current state (or reduce the current of the resistive memory cell that should be in a high current state). This phenomenon is called complementary switching (CS). The CS phenomenon is a unique phenomenon to the field of resistive memory.

Once the CS phenomenon occurs in the resistive memory cell, the resistance window (or called voltage window) of the reset operation of the memory cell will be narrowed (or even disappear). When "the resistance window is narrowed," it means that high resistance state HRS and low resistance state LRS will become difficult to distinguish. In other words, the memory cell will lose memory capability. Therefore, it is important to prevent the CS phenomenon when performing the set operation and the reset operation for the resistive memory cell. Nevertheless, the endurance of the resistive memory cell is limited. As the number of times of performing the operations (reset and/or set) increases, it is inevitable for the resistive memory cell to encounter the CS phenomenon. Thus, when the CS phenomenon occurs, how to recover the resistance window of the resistive memory cell is an important issue.

SUMMARY OF THE INVENTION

The invention provides a resistive memory and a resistance window recovery method for a resistive memory cell thereof for recovering a resistance window to extend endurance of the resistive memory cell.

In an embodiment of the invention, a resistance window recovery method of a resistive memory cell is provided. The resistance window recovery method includes: applying an over reset voltage difference between a top electrode and a bottom electrode of the resistive memory cell during a first period, wherein the over reset voltage difference falls in a reset complementary switching voltage range of the resistive memory cell; applying a set voltage difference between the top electrode and the bottom electrode of the resistive memory cell during a second period to increase a compliance current of the resistive memory cell; and performing a first reset operation on the resistive memory cell during a third period.

In an embodiment of the invention, a resistive memory is provided. The resistive memory includes a resistive memory cell, a word line signal providing circuit, a bit line signal providing circuit, and a source line signal providing circuit. The word line signal providing circuit is coupled to a word line of the resistive memory cell. The bit line signal providing circuit is coupled to a bit line of the resistive memory cell. The source line signal providing circuit is coupled to a source line of the resistive memory cell. When a resistance window recovery method is performed, the bit line signal providing circuit and the source line signal providing circuit apply an over reset voltage difference between a top electrode and a bottom electrode of the resistive memory cell during a first period, wherein the over reset voltage difference falls in a reset complementary switching voltage range of the resistive memory cell. The bit line signal providing circuit and the source line signal providing circuit apply a set voltage difference between the top electrode and the bottom electrode of the resistive memory cell during a second period to increase a compliance current of the resistive memory cell. The word line signal providing circuit, the bit line signal providing circuit, and the source line signal providing circuit perform a first reset operation on the resistive memory cell during a third period.

Based on the above, the resistive memory as disclosed in the embodiments of the invention is capable of performing the resistance window recovery method for the resistive memory cell. The over reset voltage difference is applied to the resistive memory cell and then the set voltage difference is applied to the resistive memory cell, so as to recover the resistance window. Recovery of the resistance window of the resistive memory cell means that the endurance of the resistive memory cell is extended.

To make the aforementioned and other features and advantages of the invention more comprehensible, several embodiments accompanied with figures are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
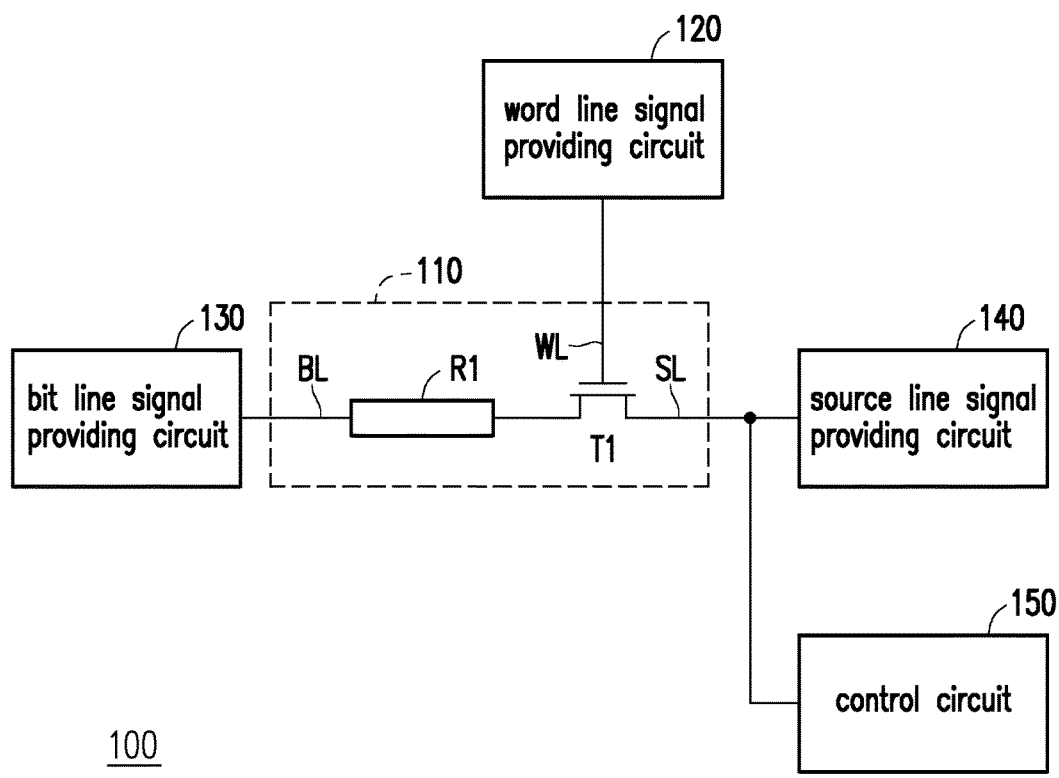
FIG. 1 is a circuit block diagram of a resistive memory according to an embodiment of the invention.

The term "couple (or connect)" used throughout this specification (including the claims) may refer to any direct or indirect connection means. For example, if it is described that the first device is coupled (or connected) to the second device, it should be understood that the first device may be directly connected to the second device or indirectly connected to the second device through other devices or certain connection means. Moreover, elements/components/steps with the same reference numerals represent the same or similar parts in the figures and embodiments where appropriate. Descriptions of the elements/components/steps with the same reference numerals or terms in different embodiments may be reference for one another.

FIG. 1 is a circuit block diagram of a resistive memory 100 according to an embodiment of the invention. The resistive memory 100 includes a resistive memory cell 110, a word line signal providing circuit 120, a bit line signal providing circuit 130, and a source line signal providing circuit 140. The word line signal providing circuit 120 is coupled to a word line WL of the resistive memory cell 110. The bit line signal providing circuit 130 is coupled to a bit line BL of the resistive memory cell 110. The source line signal providing circuit 140 is coupled to a source line SL of the resistive memory cell 110. In this embodiment, the resistive memory cell 110 includes a switch unit (e.g., transistor T1) and a resistor R1.

The resistor R1 has a top electrode and a bottom electrode. The resistor R1 may be realized by an excessive metal oxide layer. However, this embodiment of the invention is not limited thereto. Those who apply this embodiment may realize the resistor R1 in any suitable manner according to the design requirements. For example (but not limited thereto), the structure of the resistor R1 may be formed by stacking "the bottom electrode, a variable resistor, and the top electrode" in this order in a direction perpendicular to a substrate. For example, a material of the bottom electrode deposited on a single crystal substrate of $LaAlO_3$ (LAO) may be a $YBa_2Cu_3O_7$ (YBCO) film; a material of the variable resistor body may be a $Pr_{1-x}Ca_xMnO_3$ (PCMO) film of $ABO_3$ (Perovskite); and a material of the top electrode may be an Ag film deposited by sputtering. Besides the aforementioned $ABO_3$ (perovskite) materials, a known ZnSe—Ge heterogeneous structure or an oxide of metal, such as Ti, Nb, Hf, Zr, Ta, Ni, V, Zn, Sn, In, Th, Al, and so on may also be used as the material of the variable resistor. The resistor R1 may have different resistance characteristics depending on the materials of the variable resistor. According to a direction that a voltage is applied between the top electrode and the bottom electrode, a resistance value (resistance state) of the resistor R1 may be reversibly changed. By reading the resistance value (resistance state) of the variable resistor material, the resistor R may realize the function of the resistive memory.

The first end (the top electrode or the bottom electrode) of the resistor R1 is coupled to the bit line signal providing circuit 130 via the bit line BL. The second end (the top electrode or the bottom electrode) of the resistor R1 is coupled to the first end (e.g., drain) of the transistor T1. The second end (e.g., source) of the transistor T1 is coupled to the source line signal providing circuit 140 via the source line SL. The word line signal providing circuit 120 is coupled to the control end (e.g., gate) of the transistor T1 in the resistive memory cell 110 via the word line WL. The resistive memory 100 further includes a control circuit 150. The control circuit 150 may detect a current of the resistive memory cell 110 to determine whether a write operation thereof (e.g., a forming operation, a set operation, and/or a reset operation) is completed.

Figure 2:
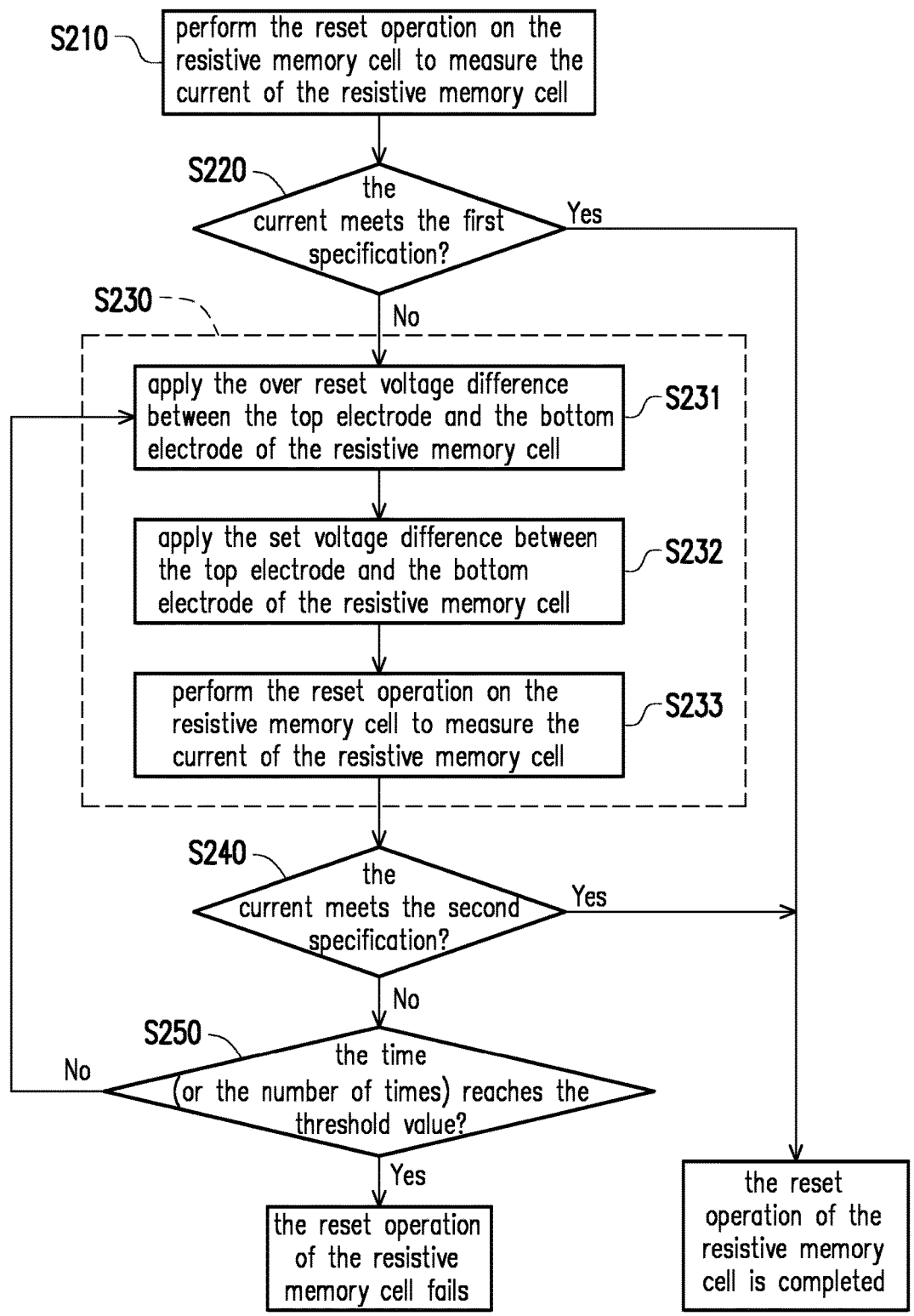
FIG. 2 is a flowchart of a resistance window recovery method for a resistive memory cell according to an embodiment of the invention.

FIG. 2 is a flowchart of a resistance window recovery method for the resistive memory cell 100 according to an embodiment of the invention. Referring to FIG. 1 and FIG. 2, in Step S210, the control circuit 150 may control the word line signal providing circuit 120, the bit line signal providing circuit 130, and the source line signal providing circuit 140 to perform the reset operation on the resistive memory cell 110 and measure the current of the resistive memory cell 110 (i.e., the current that flows through the resistor R1). Details of the reset operation performed in Step S210 may be determined according to the design requirements. In some embodiments, the word line signal providing circuit 120 may provide a voltage of 3-5V (the pulse width is 100 ns) to the word line WL, the bit line signal providing circuit 130 may provide a ground voltage to the bit line BL, and the source line signal providing circuit 140 may provide a voltage of 2-4V (the pulse width is 100 ns) to the source line SL. In some other embodiments, the source line signal providing circuit 140 may perform a ramping operation, for example, to raise the voltage of the source line SL sequentially by step voltages between 2-5V. In other embodiments, the reset operation performed in Step S210 may be a conventional reset operation and thus details thereof are not repeated hereinafter.

During the reset operation performed in Step S210, the control circuit 150 may measure the current of the resistive memory cell 110 (i.e., the current that flows through the resistor R1). In Step S220, the control circuit 150 may determine whether to perform Step S230 (the resistance window recovery method) according to a relationship between the current of the resistive memory cell 110 and a first specification sped. The first specification spec1 may be determined according to the design requirements. For example, in some embodiments, the first specification spec1 may include "after the reset operation, the current of the resistive memory cell 110 does not exceed 1 uA." If it is determined in Step S220 that the current of the resistive memory cell 110 meets the first specification spec1, it indicates that the reset operation of the resistive memory cell 110 is successful and thus this reset operation is completed (ends). If it is determined in Step S220 that the current of the resistive memory cell 110 does not meet the first specification spec1, it indicates that the reset operation of the resistive memory cell 110 fails and thus Step S230 (the resistance window recovery method) needs to be executed.

Figure 3:
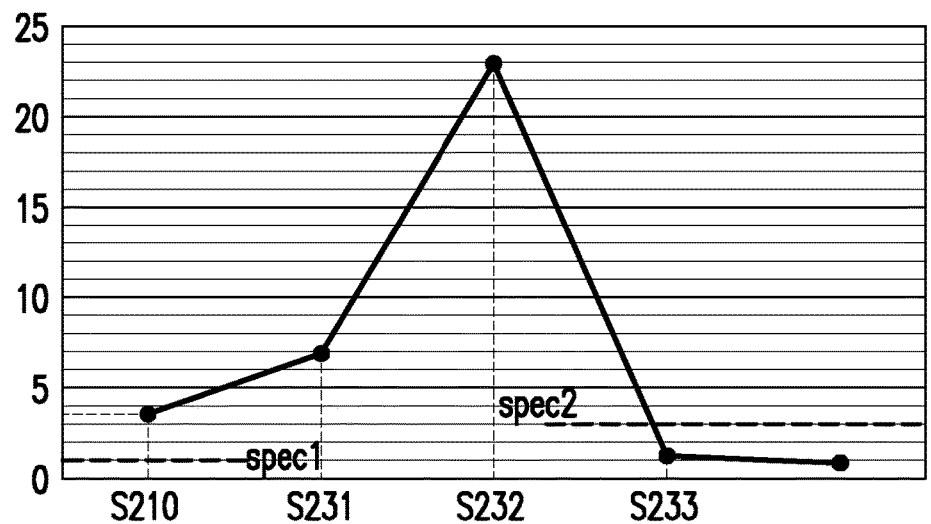
FIG. 3 is a graph showing a current change of the resistive memory cell of FIG. 1 according to an embodiment of the invention.

FIG. 3 is a graph showing a current change of the resistive memory cell 110 of FIG. 1 according to an embodiment of the invention. The vertical axis of FIG. 3 represents the current (the unit is uA) of the resistive memory cell 110 and the horizontal axis represents the steps shown in FIG. 2. Please refer to FIG. 1 to FIG. 3. In Step S220, the control circuit 150 may determine whether the current of the resistive memory cell 110 meets the first specification spec1 (e.g., 1 uA). In the embodiment shown in FIG. 3, the current of the resistive memory cell 110 measured in Step S210 is about 3.5 uA (which exceeds the first specification sped). Thus, Step S230 (the resistance window recovery method) needs to be executed.

In the embodiment shown in FIG. 2, Step S230 includes Step S231, Step S232, and Step S233. The control circuit 150 may control the word line signal providing circuit 120, the bit line signal providing circuit 130, and the source line signal providing circuit 140 to perform Step S231, Step S232, and Step S233.

In Step S231, the bit line signal providing circuit 130 and the source line signal providing circuit 140 apply an over reset voltage difference between the top electrode and the bottom electrode of the resistive memory cell 110 during a first period. The over reset voltage difference falls in a "reset complementary switching voltage range" of the resistive memory cell 110. The over reset voltage difference may be determined according to the design requirements. For example (but not limited thereto), in some embodiments, the word line signal providing circuit 120 may provide a first high voltage (e.g., a voltage of 6V or other voltages, and the pulse width is 100 ns) to the word line WL, the bit line signal providing circuit 130 may provide a reference voltage (e.g., a ground voltage or other fixed voltages) to the bit line BL, and the source line signal providing circuit 140 may provide a second high voltage (e.g., a voltage of 5V or other voltage, and the pulse width is 100 ns) to the source line SL.

Figure 4:
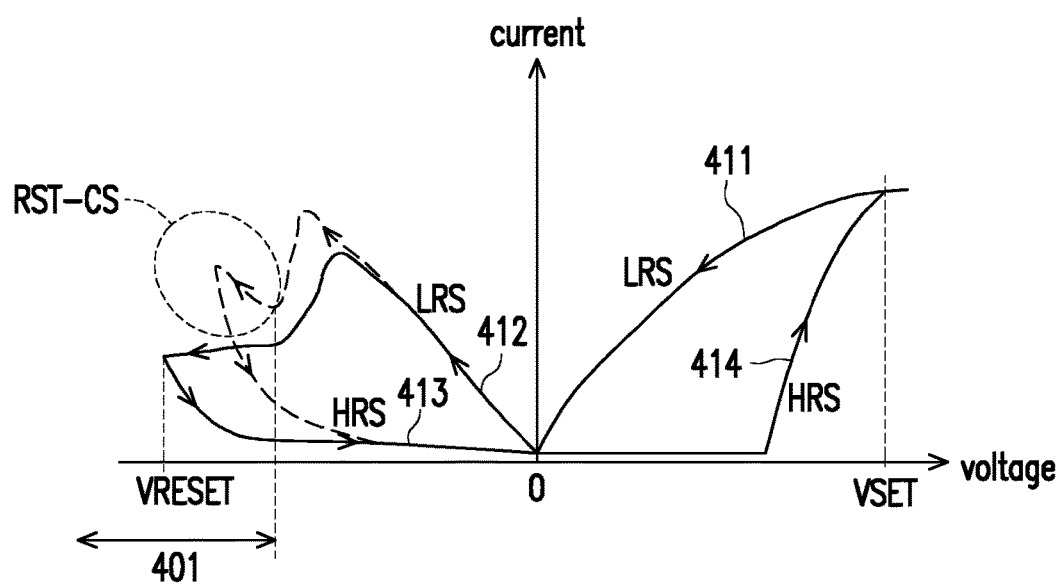
FIG. 4 is a graph showing characteristic curves of the resistive memory cell of FIG. 1 according to an embodiment.

FIG. 4 is a graph showing characteristic curves of the resistive memory cell 110 (the resistor R1) of FIG. 1 according to an embodiment. The horizontal axis of FIG. 4 represents a voltage difference (obtained by subtracting a bottom electrode voltage from a top electrode voltage) between the top electrode and the bottom electrode of the resistive memory cell 110, and the vertical axis represents the value of the current that flows through the resistive memory cell 110. The curves 411 and 412 represent current-to-voltage characteristic curves of the resistive memory cell 110 in the low resistance state LRS, and the curves 413 and 414 represent current-to-voltage characteristic curves of the resistive memory cell 110 in the high resistance state HRS. Depending on the materials, for a normal memory cell, the resistance value of the low resistance state LRS may be dozens of ohms or hundreds of ohms (e.g., several KΩ) and the resistance value of the high resistance state HRS may be dozens of times or more greater than the resistance value of the low resistance state LRS (e.g., 10K-100MΩ). It is assumed that the resistor R1 is in the high resistance state HRS (refer to the curve 414), and when the voltage difference between the top electrode and the bottom electrode of the resistor R1 is greater than a set voltage VSET, the "set" operation occurs in the resistor R1, such that the resistance state of the resistor R1 changes from the high resistance state HRS to the low resistance state LRS. Referring to the curve 412, when the voltage difference between the top electrode and the bottom electrode of the resistor R1 in the low resistance state LRS is smaller than a reset voltage VRESET, the "reset" operation occurs in the resistor R1, such that the resistance state of the resistor R1 changes from the low resistance state LRS to the high resistance state HRS.

In FIG. 4, the characteristic curve of the problematic memory cell is represented by a dotted curve while the characteristic curve of the normal memory cell is represented by a solid curve. For some problematic memory cells, when the reset operation is performed, a complementary switching (CS) phenomenon RST-CS may occur. For the normal memory cell, in the case where the voltage difference falls in the "reset complementary switching voltage range" 401, the current value of the resistive memory cell 110 decreases as the voltage difference (absolute value) increases. For the problematic memory cell (where the complementary switching phenomenon RST-CS occurs, for example), in the case where the voltage difference falls in the "reset complementary switching voltage range" 401, the current value of the resistive memory cell 110 does not decrease but increases as the voltage difference (absolute value) increases.

The over reset voltage difference applied in Step S231 falls in the "reset complementary switching voltage range" 401 of the resistive memory cell 110. FIG. 3 illustrates that, after the bit line signal providing circuit 130 and the source line signal providing circuit 140 apply the over reset voltage difference to the resistive memory cell 110 (Step S231), the current of the resistive memory cell 110 is about 7 μA.

Please refer to FIG. 1 to FIG. 2. The bit line signal providing circuit 130 and the source line signal providing circuit 140 apply a set voltage difference between the top electrode and the bottom electrode of the resistive memory cell 110 during a second period (Step S232) to increase a compliance current of the resistive memory cell 110. The set voltage difference may be determined according to the design requirements. For example (but not limited thereto), in some embodiments, the bit line signal providing circuit 130 may provide a first voltage (e.g., a voltage of 2-4V or other voltages, and the pulse width is 100 ns) to the bit line BL, the word line signal providing circuit 120 may provide a second voltage (e.g., a voltage of 3.2V or other voltages, and the pulse width is 100 ns) to the word line WL, and the source line signal providing circuit 140 may provide a reference voltage (e.g., a ground voltage or other fixed voltages) to the source line SL. A general word line voltage in a general set operation is about 2-4V. The second voltage may be greater than the general word line voltage in the general set operation, so as to increase the compliance current of the resistive memory cell 110. In some other embodiments, the word line signal providing circuit 120 may provide a voltage of 2-4V to the word line WL, and the bit line signal providing circuit 130 may provide a voltage of 2-4V to the bit line BL, but the voltage pulse widths of the word line WL and the bit line BL are greater than 100 ns (e.g., several hundred nanoseconds or several microseconds). FIG. 3 illustrates that, after the bit line signal providing circuit 130 and the source line signal providing circuit 140 apply the set voltage difference to the resistive memory cell 110 (Step S232), the current of the resistive memory cell 110 is about 23 μA.

The word line signal providing circuit 120, the bit line signal providing circuit 130, and the source line signal providing circuit 140 perform the reset operation on the resistive memory cell 110 during a third period (Step S233). Details of the reset operation performed in Step S233 may be determined according to the design requirements. In some embodiments, the reset operation performed in Step S233 may be the same as (or similar to) the reset operation performed in Step S210. In some other embodiments, the source line signal providing circuit 140 may perform the ramping operation in Step S233, for example, to raise the voltage of the source line SL sequentially by step voltages between 2-5V. In other embodiments, the reset operation performed in Step S233 may be the conventional reset operation and thus details thereof are not repeated hereinafter.

The control circuit 150 may measure the current of the resistive memory cell 110 in the reset operation of Step S233. FIG. 3 illustrates that, after the reset operation is performed in Step S233, the current of the resistive memory cell 110 is about 1 μA. In Step S240, the current measured in Step S233 is compared with a second specification spec2 to obtain a relationship therebetween. The second specification spec2 may be determined according to the design requirements. For example, in some embodiments, the second specification spec2 may include "after the reset operation, the current of the resistive memory cell 110 does not exceed 3 uA." The second specification spec2 may be greater than the first specification spec1. In some other embodiments, the second specification spec2 may be the same as the first specification spec1. The control circuit 150 may determine whether to perform Step S230 (the resistance window recovery method) again according to the relationship between the current of the resistive memory cell 110 and the second specification spec2.

If it is determined in Step S240 that the current of the resistive memory cell 110 meets the second specification spec2, it indicates that the reset operation of the resistive memory cell 110 is successful and thus this reset operation is completed (ends). If it is determined in Step S240 that the current of the resistive memory cell 110 does not meet the second specification spec2, it indicates that the reset operation of the resistive memory cell 110 fails and thus Step S250 needs to be executed to determine whether to perform Step S230 (the resistance window recovery method) again.

In some embodiments, in Step S250, a total time (a time length) of executing Step S230 multiple times may be compared with a threshold value to obtain a relationship therebetween. In some other embodiments, in Step S250, the total number of times (the number of times) of executing Step S230 may be compared with the threshold value to obtain a relationship therebetween. The control circuit may count the time length (or the number of times) of performing the resistance window recovery method. In Step S250, the control circuit 150 may determine whether to stop executing Step S230 (the resistance window recovery method) again according to the time length (or the number of times). If it is determined in Step S250 that the time length (or the number of times) does not reach the threshold value, Step S230 (the resistance window recovery method) is performed again. If it is determined in Step S250 that the time length (or the number of times) has reached the threshold value, the reset operation of the resistive memory cell 110 may be determined as failure. That is, the life of the resistive memory cell 110 has been exhausted.

It should be noted that, in different application contexts, the related functions of the control circuit 150 shown in FIG. 1 and/or the related functions of the flowchart shown in FIG. 1 may be implemented as software, firmware, or hardware by using general programming languages (e.g., C or C++), hardware description languages (e.g., Verilog HDL or VHDL), or other suitable programming languages. The programming languages capable of executing the related functions may be deployed as any known computer-accessible media, such as magnetic tapes, semiconductor memories, magnetic disks, and compact disks (e.g., CD-ROM or DVD-ROM), or the programming languages may be transmitted through the Internet, wired communication, wireless communication, or other communication media. The programming languages may be stored in an accessible medium of a computer for a processor of the computer to access/execute programming codes of the software (firmware). In terms of hardware implementation, in combination with the aspects disclosed in the embodiments described herein, various exemplary logics, logical blocks, modules, and circuits in one or more controllers, microcontrollers, microprocessors, application-specific integrated circuits (ASICs), digital signal processors (DSPs), field programmable gate arrays (FPGAs), and/or other processing devices may be used to implemented or execute the functions described in the embodiments of the invention. In addition, the device and method of the invention may be implemented by a combination of hardware and software.

To sum up, the resistive memory 100 as disclosed in the embodiments of the invention is capable of performing the resistance window recovery method for the resistive memory cell 110. The over reset voltage difference is applied to the resistive memory cell 110 and then the set voltage difference is applied to the resistive memory cell 110, so as to recover the resistance window. Recovery of the resistance window of the resistive memory cell 110 means that the endurance of the resistive memory cell 110 is extended.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A resistance window recovery method of a resistive memory cell, comprising:
    applying an over reset voltage difference between a top electrode and a bottom electrode of the resistive memory cell during a first period, wherein the over reset voltage difference falls in a reset complementary switching voltage range of the resistive memory cell;
    applying a set voltage difference between the top electrode and the bottom electrode of the resistive memory cell during a second period to increase a compliance current of the resistive memory cell; and
    performing a first reset operation by applying a reset voltage difference between the top electrode and the bottom electrode of the resistive memory cell during a third period,
    wherein the over reset voltage difference is larger than the reset voltage difference.

2. The resistance window recovery method according to claim 1, further comprising:
    performing a second reset operation on the resistive memory cell to measure at least one first current of the resistive memory cell; and
    determining whether to perform the resistance window recovery method according to a relationship between the at least one first current and a first specification.

3. The resistance window recovery method according to claim 1, further comprising:
    measuring at least one second current of the resistive memory cell in the first reset operation; and
    determining whether to perform the resistance window recovery method again according to a relationship between the at least one second current and a second specification.

4. The resistance window recovery method according to claim 3, further comprising:
    counting a time length or a number of times of performing the resistance window recovery method; and
    determining whether to stop the resistance window recovery method according to the time length or the number of times.

5. The resistance window recovery method according to claim 1, wherein applying the over reset voltage difference comprises:
    providing a reference voltage to a bit line of the resistive memory cell;
    providing a first high voltage to a word line of the resistive memory cell; and providing a second high voltage to a source line of the resistive memory cell.

6. The resistance window recovery method according to claim 5, wherein the reference voltage comprises a ground voltage, the first high voltage is 5-7V, and the second high voltage is 4-6V.

7. The resistance window recovery method according to claim 1, wherein applying the set voltage difference comprises:
providing a first voltage to a bit line of the resistive memory cell;
providing a second voltage to a word line of the resistive memory cell; and
providing a reference voltage to a source line of the resistive memory cell.

8. The resistance window recovery method according to claim 7, wherein the reference voltage comprises a ground voltage, the first voltage is 2-4V, and the second voltage is 3-5V, wherein the second voltage is greater than a general word line voltage in a general set operation.

9. A resistive memory, comprising:
a resistive memory cell;
a word line signal providing circuit coupled to a word line of the resistive memory cell;
a bit line signal providing circuit coupled to a bit line of the resistive memory cell; and
a source line signal providing circuit coupled to a source line of the resistive memory cell, wherein when a resistance window recovery method is performed, the bit line signal providing circuit and the source line signal providing circuit apply an over reset voltage difference between a top electrode and a bottom electrode of the resistive memory cell during a first period, the bit line signal providing circuit and the source line signal providing circuit apply a set voltage difference between the top electrode and the bottom electrode of the resistive memory cell during a second period to increase a compliance current of the resistive memory cell, and the word line signal providing circuit, the bit line signal providing circuit and the source line signal providing circuit perform a first reset operation by applying a reset voltage difference between the top electrode and the bottom electrode of the resistive memory cell during a third period, wherein the over reset voltage difference falls in a reset complementary switching voltage range of the resistive memory cell, wherein the over reset voltage difference is larger than the reset voltage difference.

10. The resistive memory according to claim 9, further comprising:
a control circuit configured to control the word line signal providing circuit, the bit line signal providing circuit and the source line signal providing circuit to perform a second reset operation on the resistive memory cell and measure at least one first current of the resistive memory cell, wherein the control circuit determines whether to perform the resistance window recovery method according to a relationship between the at least one first current and a first specification.

11. The resistive memory according to claim 9, further comprising:
a control circuit configured to measure at least one second current of the resistive memory cell in the first reset operation, wherein the control circuit determines whether to perform the resistance window recovery method again according to a relationship between the at least one second current and a second specification.

12. The resistive memory according to claim 11, wherein the control circuit counts a time length or a number of times of performing the resistance window recovery method, and the control circuit determines whether to stop the resistance window recovery method according to the time length or the number of times.

13. The resistive memory according to claim 9, wherein applying of the over reset voltage difference is that the bit line signal providing circuit provides a reference voltage to the bit line, the word line signal providing circuit provides a first high voltage to the word line, and the source line signal providing circuit provides a second high voltage to the source line.

14. The resistive memory according to claim 13, wherein the reference voltage comprises a ground voltage, the first high voltage is 5-7V, and the second high voltage is 4-6V.

15. The resistive memory according to claim 9, wherein applying of the set voltage difference is that the bit line signal providing circuit provides a first voltage to the bit line, the word line signal providing circuit provides a second voltage to the word line, and the source line signal providing circuit provides a reference voltage to the source line.

16. The resistive memory according to claim 15, wherein the reference voltage comprises a ground voltage, the first voltage is 2-4V, and the second voltage is 3-5V, wherein the second voltage is greater than a general word line voltage in a general set operation.

* * * * *